US006636122B2

United States Patent
Tsyrganovich

(10) Patent No.: US 6,636,122 B2
(45) Date of Patent: *Oct. 21, 2003

(54) ANALOG FREQUENCY LOCKED LOOP WITH DIGITAL OVERSAMPLING FEEDBACK CONTROL AND FILTER

(75) Inventor: Anatoliy V. Tsyrganovich, San Jose, CA (US)

(73) Assignee: Zilog, Inc., San Jose, CA (US)

( * ) Notice: Subject to any disclaimer, the term of this patent is extended or adjusted under 35 U.S.C. 154(b) by 21 days.

This patent is subject to a terminal disclaimer.

(21) Appl. No.: 09/973,979

(22) Filed: Oct. 9, 2001

(65) Prior Publication Data

US 2003/0067354 A1 Apr. 10, 2003

(51) Int. Cl.[7] .................................................. H03L 7/00
(52) U.S. Cl. .......................... 331/25; 331/1 A; 331/16; 327/160; 341/143; 341/142
(58) Field of Search ............................. 331/1 A, 16, 25; 327/160; 341/126, 142, 143; 375/376

(56) References Cited

U.S. PATENT DOCUMENTS 6,323,795 B1 * 11/2001 Yang et al. ................. 341/143
2003/0067354 A1 * 4/2003 Tsyrganovich ............. 331/1 A

* cited by examiner

Primary Examiner—Arnold Kinkead
(74) Attorney, Agent, or Firm—Parsons Hsue & de Runtz LLP

(57) ABSTRACT

A filter using analog to digital conversion, digital filtering and oversampling noise reshaping is disclosed. Application of such a filter to a frequency locked oscillator is disclosed. Application of such a filter to an oscillator having a capability to synchronize with an external stimulus is disclosed.

19 Claims, 7 Drawing Sheets

ANALOG FREQUENCY LOCKED LOOP WITH DIGITAL OVERSAMPLING FEEDBACK CONTROL AND FILTER

CROSS-REFERENCE TO RELATED PATENT

U.S. Pat. No. 6,166,606 entitled PHASE AND FREQUENCY LOCKED CLOCK GENERATOR naming Anatoliy V. Tsyrganovich as inventor on Dec. 26, 2000 is incorporated herein by this reference.

FIELD OF THE INVENTION

The present invention relates generally to timing measurement and pulse comparison circuits. The present invention relates more specifically to timing measurement and pulse comparison circuits in feedback circuits in voltage-controlled oscillators, especially voltage-controlled oscillators used in FLL (frequency locked loop) circuitry.

BACKGROUND

In electronics applications it is common to generate a desired clock signal at a frequency that is referenced to the frequency of a reference signal generated by a MRO (master reference oscillator). Phase locked loop oscillators may be used for this purpose if there is a coherent phase relationship between the clock signal and the reference signal. Sometimes, however, the clock signal generator may be of a class wherein the clock signal must be synchronized to an incoherent stimulus and then frequency locked oscillators may be used. There is a need for high performance frequency locked oscillators that can be embodied cheaply such as by using a semiconductor chip and a minimum of other component(s). Phase and/or frequency locked oscillator designs often include filters that have relatively long time constants. Thus, there is a further need for filters having long time constants, and that can be embodied cheaply, for example, by using a semiconductor chip and a minimum of other component(s).

SUMMARY OF THE INVENTION

According to one aspect of the invention, a control signal generating circuit uses a digital filter having a relatively long time constant. Digital filters having relatively long time constants may be more readily and more economically embodied on semiconductor chips than are analog filters of comparable time constants. Oscillators incorporating digital filters having relatively long time constants may be more readily and more economically embodied on semiconductor chips than are analog filters of comparable time constants.

According to a specific aspect of the invention, a feedback circuit comprising at least one ramp generator; a clocked analog to digital converter circuit located downstream of the ramp generator; a conversion circuit for generating a digital correction; and a digital low pass filter for filtering the digital correction signal to produce a filtered correction signal is provided.

According to another specific aspect of the invention, a synchronized oscillator comprising a reference clock input adapted to receive a reference clock signal; a synchronizing signal input adapted to receive a synchronizing edge; a voltage-controlled oscillator for generating an output clock signal; and a feedback circuit adapted to receive the output clock signal and the reference clock signal, the feedback circuit generating the correction signal is provided.

According to another specific aspect of the invention, a method for generating a feedback signal comprising the acts of digitizing a first difference between leading edges of a first pulse and of a second pulse; digitizing a second difference between trailing edges of the first pulse and the second pulse; differencing the first difference and the second difference to produce a third difference; and performing digital to analog conversion upon a signal derived from the third difference is provided.

According to one more specific aspect of the invention, a filter comprising an analog to digital converter, a digital filter, an oversampling modulator for lowering signal bit respresentation, a digital to analog converter and an analog low pass for smoothing is provided.

According to one further specific aspect of the invention, an effective feedback circuit is implemented entirely, or to a great extent, on silicon and with few or no external off-chip interconnects and components.

Inventive feedback circuits may, for example, replace a feedback circuitry that is part of a frequency locked loop circuit such as that disclosed in U.S. Pat. No. 6,166,606 by the same inventor as the present application.

BRIEF DESCRIPTION OF THE DRAWINGS

For simplicity in description, identical components are labeled by the same numerals in this application.

DETAILED DESCRIPTION

U.S. Pat. No. 6,166,606 by the same inventor as the present application discloses a FLL (more precisely a phase and frequency locked clock generator) in which a feedback signal is generated to adjust the frequency of a resettable VCO (voltage controlled oscillator) to a frequency related to the frequency of a MRO (master reference oscillator). Because the VCO is resettable (capable of synchronizing with a non-coherent external event stimulus), there is no dependency upon any particular long-term phase relationship between the MRO and the VCO. For each of the MRO and VCO, a pulse is generated having a width of a certain respective fixed number of half-cycles of each respective signal and both pulses are fed into a pair of comparators. One of the comparators generates a leading edge gauge signal proportionate to the leading edge time differences of the two pulses. The other comparator generates a trailing edge gauge signal proportionate to the trailing edge time differences of the two pulses. Using an inverter and an analog summing circuit component, the two gauge signals are differenced and the signed result of differencing is fed to a low pass filter, the output of which is a desired signed feedback signal. The feedback signal is used to adjust the frequency of the VCO so as to tend to eliminate the net time differences between the gauge signal pulse widths and to cause the VCO to operate at desired frequency. The desired VCO frequency has a simple fixed relationship with the frequency of the MRO.

Embodiments of the present invention may be implemented using at least one digital filter having a relatively long time constant and at least one analog filter having a relatively short time constant. Such an arrangement minimizes the need for relatively expensive off-chip components.

Figure 1:
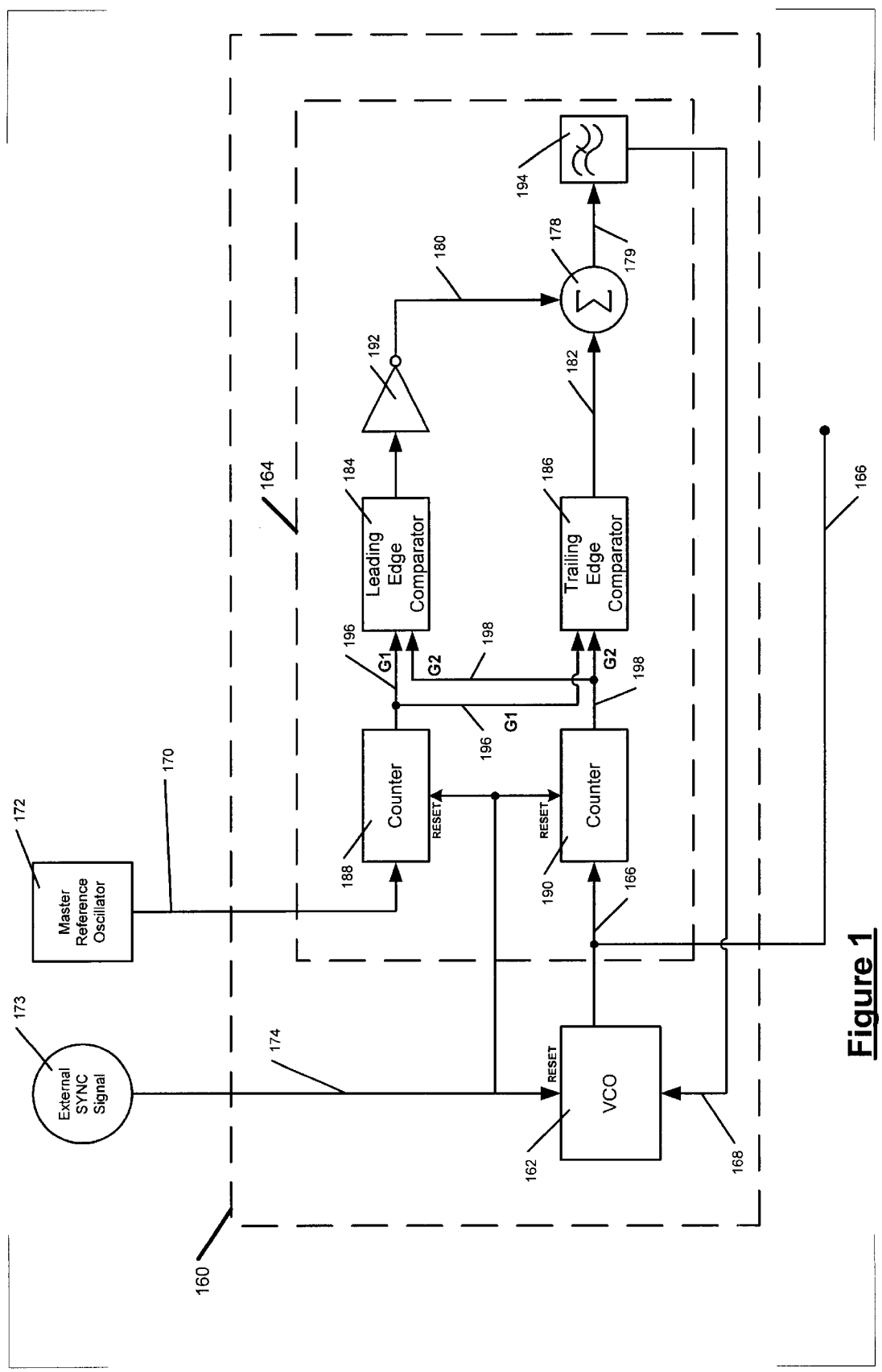
FIG. 1 shows a block diagram of a frequency locked oscillator.

FIG. 1 shows an embodiment of a frequency locked loop 160. The frequency locked loop as shown comprises two sections: a voltage-controlled oscillator 162 for generating an output clock signal 166, and a feedback circuit 164 for providing a correction signal 168 to control the frequency of the output clock signal 166 generated by the voltage-controlled oscillator 162. The frequency locked loop 160 is provided with a system clock signal 170 running at exactly at a required frequency by a system clock generator or MRO (master reference oscillator) 172. The system clock is sometimes termed a reference clock and some systems may have more than one system clock and/or reference clock. It should be noted that the system clock signal 170 is not synchronized with the synchronizing signal 174. The system clock signal 170 is, however, running at exactly the required output clock frequency. Thus, this frequency locked loop 160 is designed to generate the synchronized output clock signal 166 running at the same frequency as that of the system clock signal 170 while also having an edge synchronized with the synchronizing signal 174. Synchronizing signal 174 is provided by external SYNC signal source 173 which need not be coherent.

As shown in FIG. 1, a VCO (voltage-controlled oscillator) 162 is provided with a correction signal 168 to control the frequency of the output clock signal 166. In the embodiment as shown, the correction signal 168 is a filtered control signal provided by the feedback circuit 164. The LPF (low pass filter) 194 operates on an unfiltered control signal 179 to produce the correction signal 168. The unfiltered control signal 179 is provided by an analog summing circuit component 178 by combining two compensation pulses on conductors 180, 182. Specifically, the first compensation pulse is an inverted value from the output of a leading edge comparator 184, whereas the second compensation pulse is the output of a trailing edge comparator 186. The control signal 179 is, in effect, generated by subtracting the output of the leading edge comparator 184 from the output of the trailing edge comparator 186, thus performing comparison of the time durations of two gauge signals 196, 198. In addition, in the embodiment shown, the synchronizing signal 174 is provided to the VCO (voltage-controlled oscillator) 162 to reset the VCO 162. The voltage-controlled oscillator 162 begins to oscillate so that the first voltage transition of the output clock signal 166 of the voltage-controlled oscillator 162 coincides with a triggering edge of a synchronizing signal 174.

Still referring to FIG. 1, the feedback circuit 164 comprises two counters (i.e., a first counter 188, and a second counter 190) and two edge comparators 184, 186, an inverter 192, an analog summer 178 and a low pass filter 194. As shown in FIG. 1, the system clock signal 170 from the MRO 172 is provided to the first counter 188, whereas the output clock signal 166 generated by the VCO 162 is provided to the second counter 190. In addition, both the first and second counters 188, 190 are fed with the synchronizing signal 174 for simultaneous reset. The synchronizing signal 174 is used in this embodiment for resetting the two counters because the synchronizing signal 174 is readily available. When an edge signifying reset on the external synchronization signal 174 is received, both two counters 188, 190 are released to begin counting the numbers of pulses received.

Still referring to FIG. 1, the first counter 188 generates the first gauge signal G1 196 by reference to edges of the system clock signal 170, whereas the second counter 190 generates a second gauge signal G2 198 by reference to edges of the output clock signal 166. In the embodiment as shown, the first gauge signal G1 196 comprises a pulse having a first leading edge voltage transition (212, FIG. 2) that coincides with the first rising edge voltage transition (213, FIG. 2) of the system clock signal 170 after the edge signifying reset on the external synchronization signal 174. Furthermore, the second trailing edge voltage transition of the pulse coincides with a falling edge voltage transition of the system clock signal 170 a preset number N clock half-cycles after the reset signal is actuated. In this particular embodiment, N is a predetermined positive number that is an odd multiple of one half. In one particular exemplary embodiment N had a value of 1001.

Figure 2:
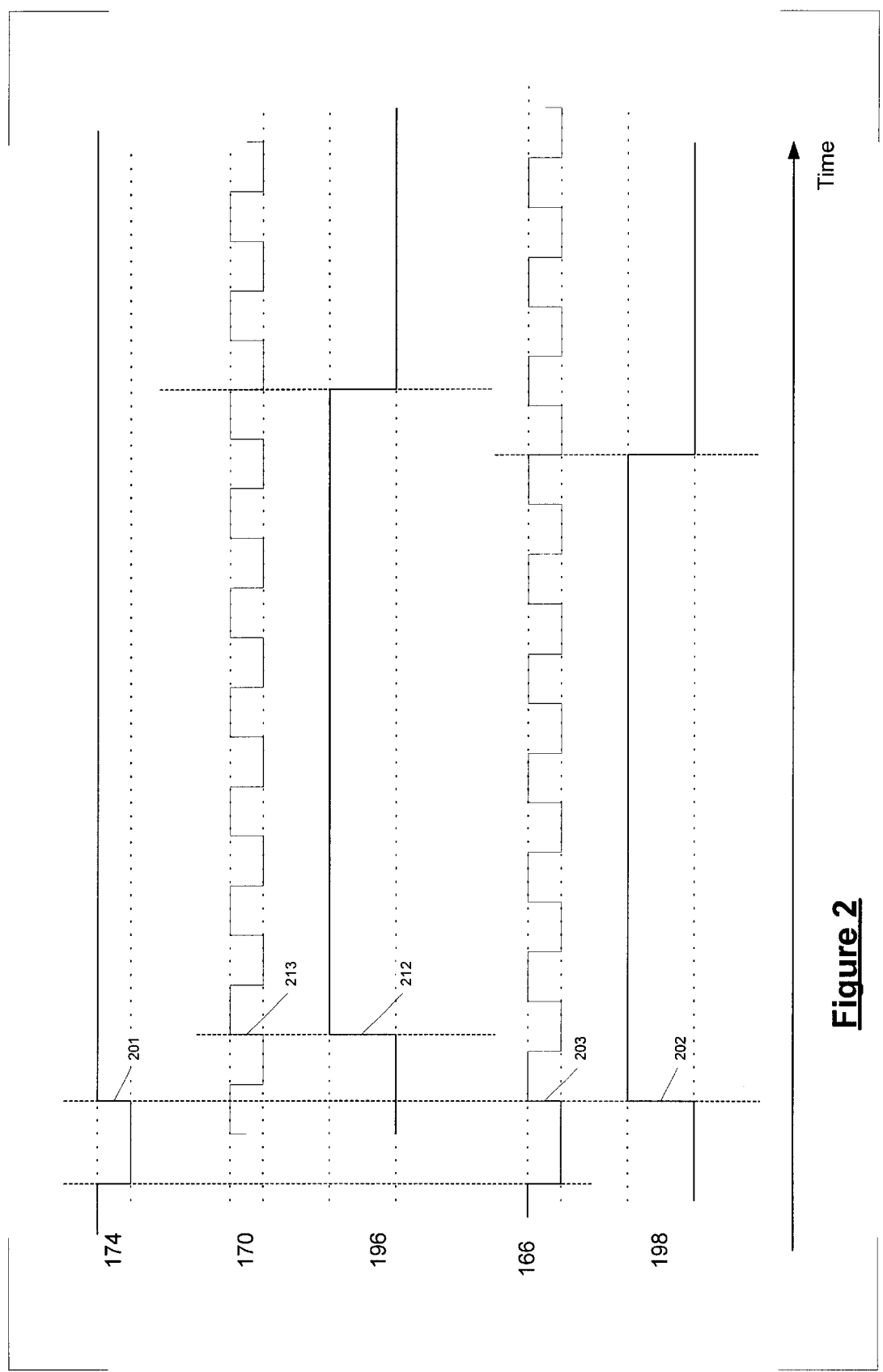
FIG. 2 shows timing diagrams of an embodiment of a frequency locked oscillator.

FIG. 2 shows a timing diagram showing relationships between various signals in the circuit of FIG. 1: external synchronization signal 174, system clock signal 170, gauge signal (pulse) G1 196, VCO output clock signal 166 and gauge signal (pulse) G2 198. The timing diagrams are exemplary only and other variations are possible, for example, external synchronization signal 174 is shown as a negative going pulse that is active on its trailing edge but it could, in other embodiments, be a positive going pulse or another form. FIG. 2 shows the relationship between the trailing (rising) edge 201 of external synchronization signal 174 to the leading (rising) edge 202 of gauge signal G2 198 and the first synchronized edge 203 of VCO output signal 166. In the example, timing diagram of FIG. 2 each counter is set to count 13 half-cycles of clock signal for the pulse width since 13 half-cycles facilitates diagramming, but practical embodiments will typically use pulses having a duration of many more than 13 half cycles of clock signal. FIG. 2 also shows the relationships between the trailing (rising) edge 201 of external synchronization signal 174, the next rising edge 213 of the reference clock signal 170, and the leading edge 212 of gauge signal G1 196.

Still referring to FIG. 2, the second gauge signal G2 198 has a pulse having a rising (leading) edge voltage transition 202 that coincides with the first rising edge voltage transition 203 of the output clock signal 166 generated by the VCO (162, FIG. 1) after a reset signal is released. The external synchronization signal 174 is used as the reset signal. The trailing edge voltage transition of the pulse G2 198 coincides with a falling edge voltage transition of the output clock signal 166 generated by the voltage-controlled oscillator 162 exactly N clock half-cycles after the edge 201 signifying reset on the external synchronization signal 174 is received. In the embodiment described above, the same predetermined value to produce a pulse of N cycles is programmed into both counters 188, 190 and the MRO 172 and the VCO 162 operate at substantially the same frequency.

In other embodiments, the MRO 172 and the VCO 162 may operate at different frequencies, typically harmonically related, but possibly related one to the other by a ratio that is preferably a simple rational number. In cases of differing operating frequencies for MRO 172 and VCO 162, the counters 188, 190 are programmed with proportionate numbers so that pulses in the gauge signals 196, 198 may have equal duration at the desired operating point. For example, if the frequency of the MRO were three times the frequency of the VCO, then the value programmed into the first counter 188 may be three times the value programmed into the second counter 190.

Figure 3:
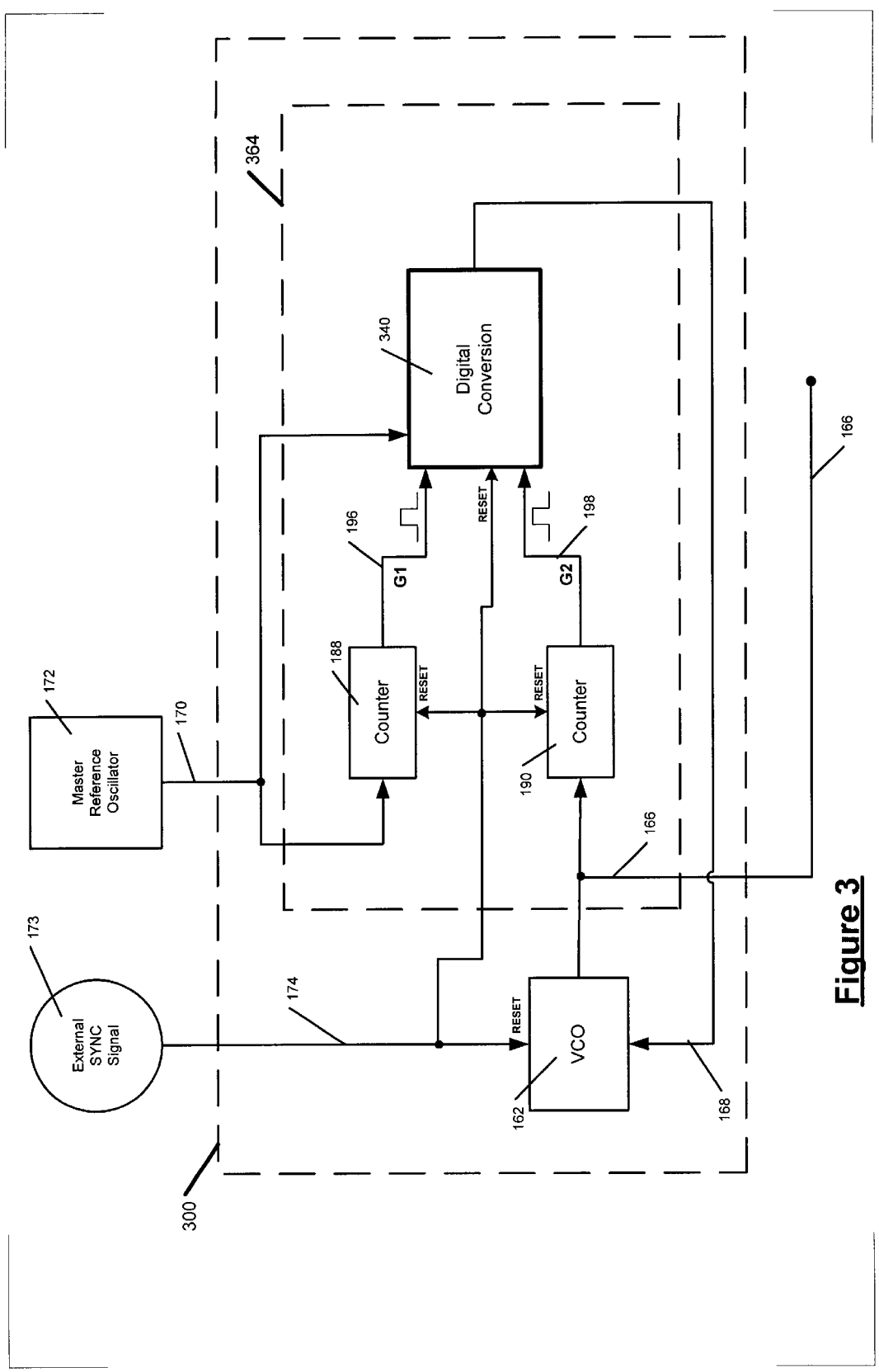
FIG. 3 shows a block diagram of an embodiment of a frequency locked oscillator according to an aspect of the invention.

FIG. 3 shows a block diagram of a frequency locked oscillator according to an aspect of the invention. Comparing the oscillator 300 with the oscillator 160 of FIG. 1, both generate gauge signals G1 196 and G2 198. However, in oscillator 300 alone, a digital conversion circuit 340 is used to generate feedback signal 168. Amongst other possible benefits, digital conversion circuit 340 can be more economically constructed than analog low pass filter 194 (FIG. 1) in the previously developed embodiments.

The frequency locked oscillator 300 of FIG. 3 has two sections, a VCO 162 and a feedback circuit 364. Counter 188 is programmed with an integer number to specify a fixed number N of system clock signal 170 half-cycles. Counter 190 is programmed with an integer number to specify a fixed but possibly different number M of output clock signal 166 half-cycles. The frequencies of the MRO 172 and VCO 162 may typically be related in a simple ratio in which case the counter may be programmed with fixed numbers N and M that may be related in a like ratio. When triggered from RESET by an external synchronization signal 174, each counter 188, 190 outputs a gauge signal which includes a positive going pulse of width equal to N or M half-cycles respectively of the respective clock signal input to the respective counter.

A pulse on gauge signal G2 198 generated by counter 190 has a width of M half-cycles of the output clock signal 166 of the VCO 162. VCO 162 is frequency controlled by feedback signal 168 and is reset by external synchronization signal 174. Thus the output clock signal 166 of VCO 162 is synchronized to external synchronization signal 174.

A pulse on gauge signal G1 196 generated by counter 188 has a width of N half-cycles of the system clock signal 170 which is the output of master reference oscillator 172. MRO 172 is free running and not synchronized with external synchronization signal 174. However, counter 188 is synchronized with external synchronization signal 174. Thus, each pulse on gauge signal G1 196 generated by counter 188 has a leading (rising) edge that coincides with first rising edge of system clock signal 170 that occurs after the active edge of external synchronization signal 174.

In the desired operating condition MRO 172 and VCO 162 operate at the exactly correctly related frequencies and the frequencies of system clock signal 170 and output clock signal 166 are in the correct precise ratio. In this desired operating condition pulses on gauge signal G1 196 and gauge signal G2 198 have the same duration, but as discussed above they are not mutually synchronized edge to edge. In fact, the leading edges may fail to coincide by as much as approximately one clock cycle of MRO 172.

Figure 4:
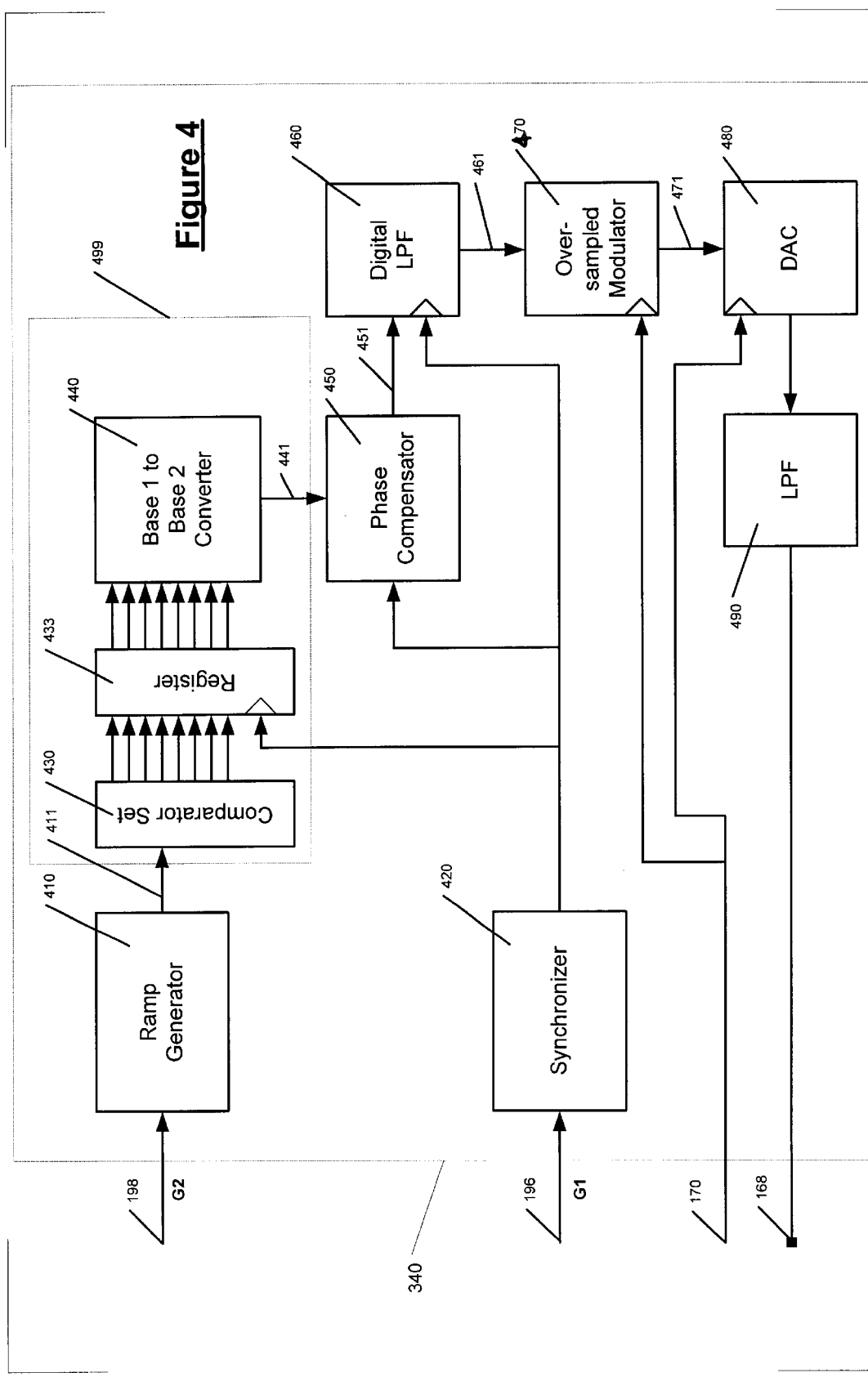
FIG. 4 shows a block diagram of a digital conversion circuit used generate feedback signal according to an aspect of the invention.

FIG. 4 shows a block diagram of a digital conversion circuit used generate feedback signal according to an aspect of the invention. Digital conversion circuit 340 has two pulsed inputs, gauge signal G1 196, and gauge signal G2 198. Digital conversion circuit 340 also receives system clock signal 170. Digital conversion circuit 340 has one output, analog feedback correction signal 168. Each of the pulses carried by gauge signals G1 196 and G2 198 has a rising edge and a falling edge. Because gauge signal G2 198 is locked to the external synchronization signal 174 (FIG. 2), it will have a rising edge that occurs prior to or simultaneously with the rising edge of the corresponding pulse carried by gauge signal G1 196.

Still referring to FIG. 4, when a rising edge of pulse on G2 198 triggers ramp generator 410 a ramp signal 411 is produced. Techniques for ramp generators are well known in the art and may take various forms.

Figure 5:
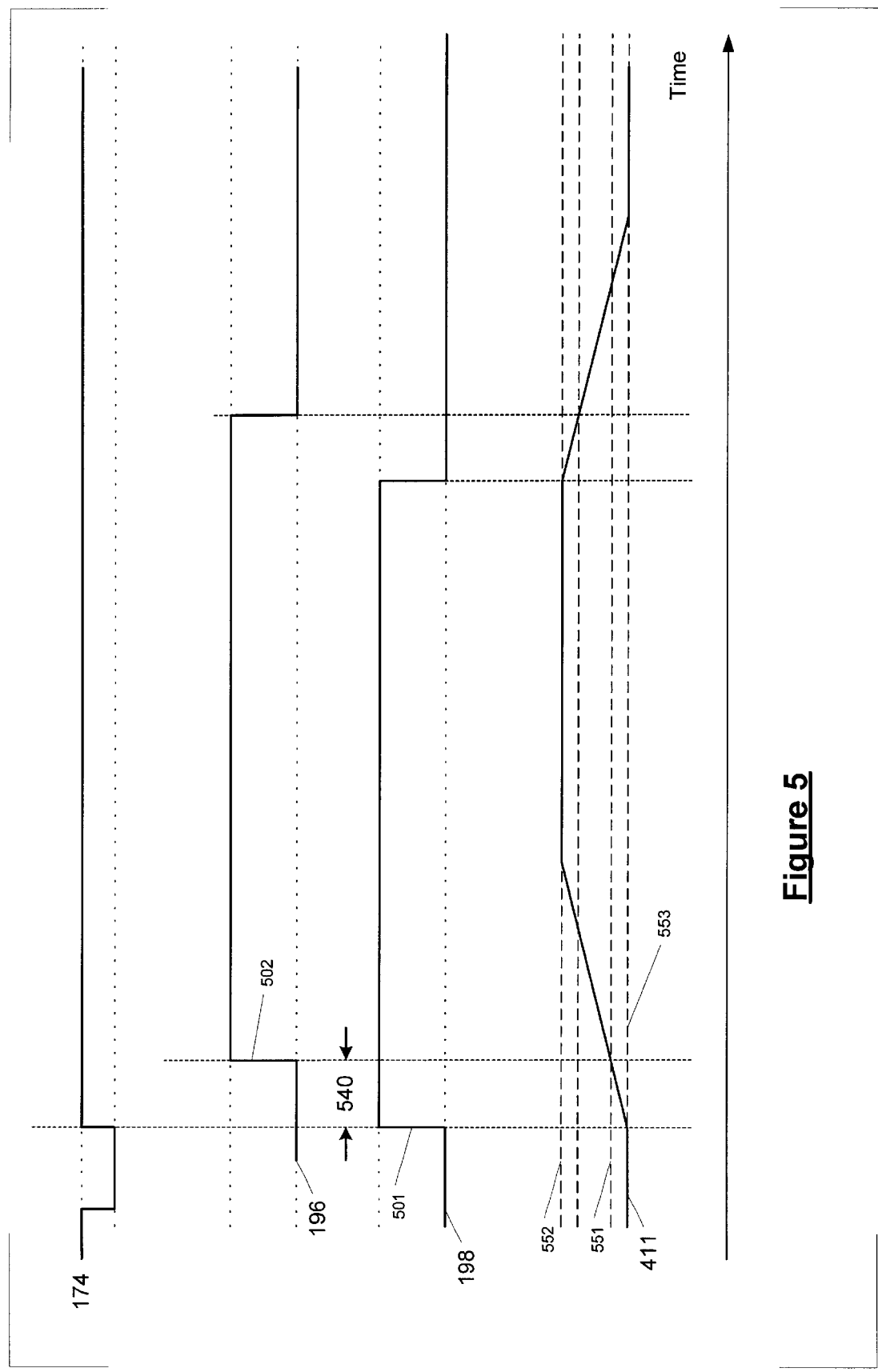
FIG. 5 shows timing diagrams of an embodiment of a frequency locked oscillator according to an aspect of the invention.

FIG. 5 shows a timing diagram for an oscillator according to FIG. 3, with external synchronization signal 174, pulses of gauge signals G1 196, G2 198 and ramp signal 411. At the moment of leading edge 501 of pulse on gauge signal G2 198, a ramp signal 411 begins to slew from datum 553 towards a rail voltage 552. The ramp signal may typically take a little more than one cycle of the system clock signal to slew from datum to rail. Later, upon the leading edge 502 of pulse on gauge signal G1 196, ramp signal 411 has a snapshot voltage 551 which is some fraction of rail voltage 552. This snapshot voltage 551 is dependent upon, and hence a measure of, the leading edges time difference 540 between the leading edge 501 of pulse on gauge signal G2 198 and the leading edge 502 of pulse on gauge signal G1 196. Ramp generator 410 (FIG. 4) may generate a ramp that may be non-linear; the exact shape of the ramp signal 411 is not critical. As described below, the digital conversion circuit is responsive to the snapshot voltage 551.

Figure 6:
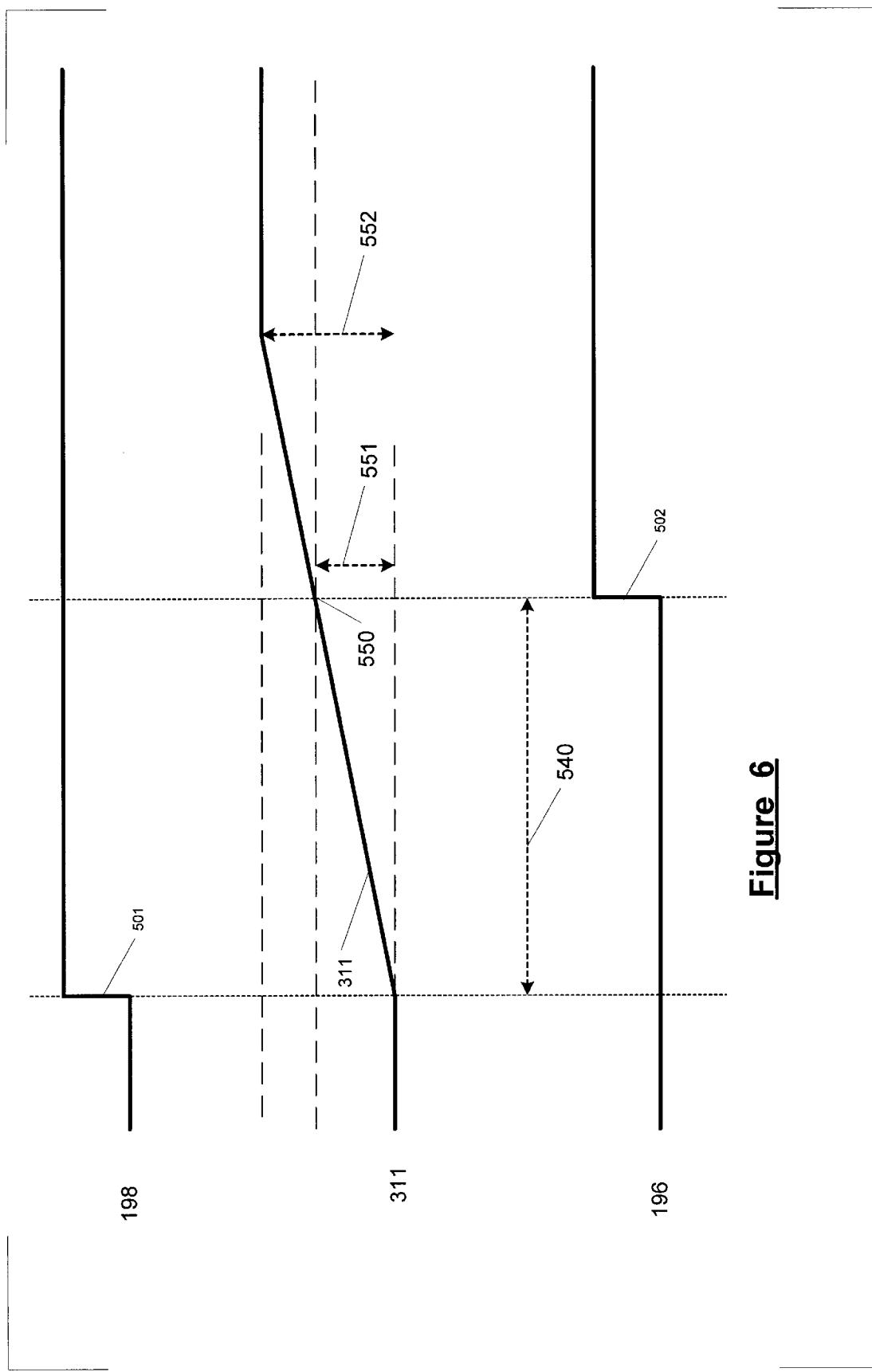
FIG. 6 shows further timing diagrams of an embodiment of a frequency locked oscillator according to an aspect of the invention.

FIG. 6 shows an enlarged version of part of the timing diagrams of FIG. 5. The same reference numbers are used for the same features, however, FIG. 6 shows more clearly the relationship between the leading edges time difference 540 and the snapshot voltage 551. As the frequency of the VCO changes under the influence of the analog feedback signal then so will the leading edges time difference 540 change. As the leading edges time difference 540 changes so will the snapshot voltage 551. The snapshot voltage 551 thus represents an error (leading edges time difference 540) due to the mismatch in the leading edges of signals G1 196 and G2 198. As described below, this error is to be subtracted from a similar error due to the trailing edges time difference.

Referring back to FIG. 4, ramp signal 411 becomes input to a comparator set 430. Comparator sets are well known in the art and may be embodied, for example, as a set of threshold detectors wherein each threshold is a successive fraction of a full-scale input. Threshold detectors may, for example, be implemented as comparators connected to reference voltage sources. Thus, comparator set 430 has a number of binary (2-state) outputs, one for each threshold detector. The number of threshold detectors determines the accuracy of the error measurement. For example, FIG. 4 shows comparator set 430 as having eight binary outputs and hence eight threshold detectors. Each threshold detector output is turned on (binary 1) whenever the ramp signal exceeds the threshold voltage for the corresponding detector or comparator. The outputs of comparator set 430 are latched into register 433 in response to register 433 being clocked by synchronizer 420. Synchronizer 420 receives a pulse on gauge signal G1 196 and clocks register 433 upon either edge of the pulse (rising or falling). Considering for a moment the case where register 433 is clocked by synchronizer 420 for the rising edge of pulse on gauge signal G1 196, the value latched into the register is the number of comparators turned on at that moment which value, in turn, depends upon the snapshot voltage 551 (FIGS. 5 and 6). Thus, the value latched into register 433 may be viewed as a base 1 number that represents the approximate value of snapshot voltage 551 (FIGS. 5 and 6) and thus represents a measure of the leading edges time difference 540 (FIGS. 5 and 6). The use of a register allows the value to be captured and held steady pending further downstream processing.

Still referring to FIG. 4, the Base 1 to Base 2 Converter 440 converts the latched output of register 433 to a conventional unsigned binary (base 2) number represented on multiple conductor output 441. This binary number also represents (may be roughly proportional to) the leading edge time difference 540. Taken together, the combination of comparator set 430, register 433 and Base 1 to Base 2 Converter 440 may be broadly regarded as constituting a clocked ADC (analog to digital converter) circuit 499. Other forms of clocked ADC circuit are possible within the general scope of the invention. Additional signal conditioning may be provided with advantage, and the clocked ADC or equivalent circuits could be operably configured with different topology, but still downstream of a ramp generator.

A similar sequence of events may take place on the corresponding falling edges of the pulses in the gauge signals G1 196 and G2 198. A second binary number (also appearing on conductors 441) may be generated to represent the trailing edge time difference between the pulses on gauge signals G1 196 and G2 198. Synchronizer 420 strobes phase compensator 450 to receive one after the other numbers representing the two edge time differences and to perform simple binary subtraction to produce a signed binary number that represents a difference in width (duration) between the two pulses. This signed binary number representing the difference in duration of the two pulses is thus a measure of the frequency difference between the MRO and the VCO. The same signed binary number becomes used as a digital unfiltered VCO correction signal and is sent to multiple conductor port 451. Signed binary number on port 451 is fed to digital LPF (low pass filter) 460 which, precisely because it is digital, may have a long time constant without the use of expensive analog components. Also, since the digital LPF 460 performs essentially a smoothing operation, it may usefully have an output precision considerably greater than the input 451. In one exemplary embodiment, the signed binary number input to the digital LPF input 451 is 4 bits wide (limited primarily by the resolution of the comparator set) and the LPF output 461 is 16 bits of resolution. Greater resolution than that provided by a 16 bit output from the digital LPF 460 may be required for some applications. At the desired operating point of equal or correctly related MRO and VCO frequencies, the correction signal presented on port 451 will be zero. The output of the digital LPF may usefully be an unsigned number with the ideal operating point at mid-range.

Still referring to FIG. 4, the digital LPF output 461 is fed to an oversampling noise reshaping modulator 470 which operates according to techniques that are well-known in the art. Noise reshaping modulators convert slow changing high precision inputs to fast changing low precision outputs that, suitably scaled, have the same precise average value as the corresponding input (assuming an invariant input).

The oversampling noise reshaping modulator 470 may be clocked by any convenient high frequency clock source such as the system clock signal 170. In the present context, oversampling implies that the oversampling noise reshaping modulator 470 samples its input signal and generates an output signal at a rate far in excess of the rate at which the input is changing. Since the input to oversampling noise reshaping modulator 470 is the output signal of the digital LPF, and since the digital LPF has a long time constant, in fact the input to the noise reshaping modulator 470 changes quite slowly. Thus, the same input value will be sampled many times. If the MRO runs at 50 MHz (which is a realistic possible value, however, the invention can operates over an extremely broad range of frequencies), then the output of noise reshaping modulator 470 is modulated at 50 MHz also. Output port 471 of noise reshaping modulator 470 may typically be four bits wide, allowing the modulator to generate values in the range −8 to +7 for example.

Figure 7:
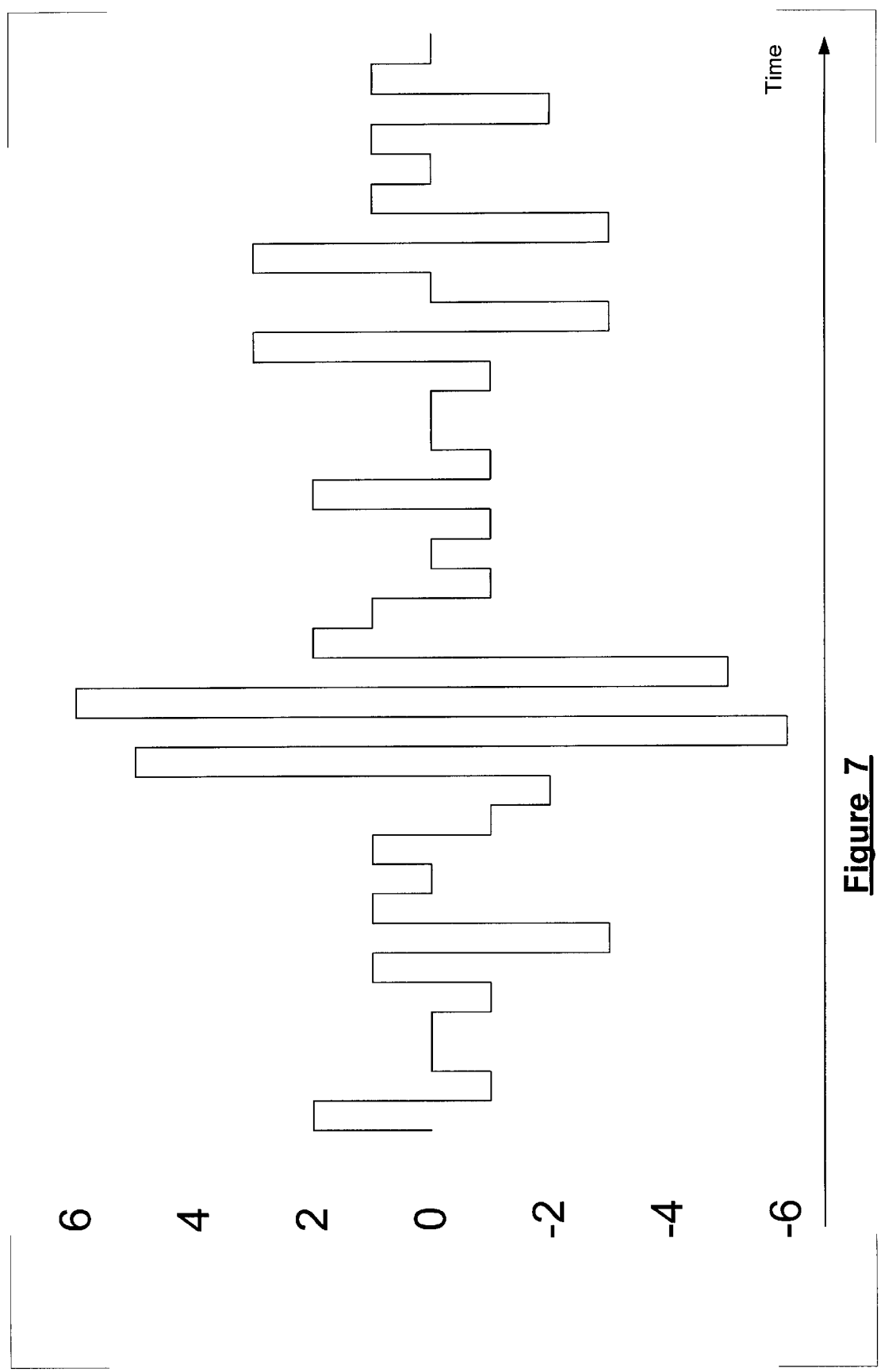
FIG. 7 shows typical oversampling modulator output waveforms of an embodiment according to an aspect of the invention.

FIG. 7 shows a typical output signal from noise reshaping modulator 470, changing output signal level at intervals equivalent to 50 MHz. The use of 50 MHz, or indeed of the system clock signal 170 is not at all critical and noise reshaping modulator 470 may be clocked by any high frequency signal that might be conveniently available. An aspect of a noise reshaping modulator is that it may convert a lower data rate/higher precision signal into a higher data rate/lower precision signal whilst maintaining sufficient accuracy. The noise reshaping modulator 470 may operate in accordance with well-known Sigma-Delta principles. Thus, the average, over a time interval, of the output signal value is at a correct level and may have a good precision even though the level of output signal itself may have a lower precision and may change continually. In the example shown in FIG. 7, the output precision is four bits in precision and so the noise reshaping modulator 470 output port 471 (FIG. 4) has correspondingly at least four conductors. A binary four bit number may permit integer values in the range −8 to +7 to be represented.

Referring back to FIG. 4, the (typically four bits wide) output signal of the noise reshaping modulator 470 is input to a DAC (digital to analog converter) 480 which has a typical precision of only four bits. Such a DAC may be economically constructed because it requires only a few current sources to implement. DAC 480 may be clocked by the same clock signal 170 that is used to strobe the noise reshaping modulator 470. The output from DAC 480 is a rapidly changing low precision current, the average value of which represents the time difference between the pulse widths and hence the value of the feedback signal 168. A short time constant VHF LPF (very high frequency low pass filter) 490 is required to generate a stable feedback signal 168 free of significant noise and with a slew rate determined by the long time constant of the digital LPF 460. In the exemplary embodiment of a 50 MHz clock rate into noise reshaping modulator 470, VHF LPF 460 could be implemented with a time constant on the order of one microsecond. Since the VHF LPF 490 implements a very small time constant, it can be embodied as a capacitor on-Silicon and thus the entire frequency locked loop 300 (FIG. 3) can be embodied on-chip with great economy as compared to previously developed embodiments of circuits that perform similar functions.

Whilst the invention has been described above by reference to various embodiments, it will be understood that changes and modifications may be made without departing from the scope of the invention, which is to be defined only by the appended claims and their equivalent. For example, the function of the ramp generator could be provided by two separate ramp generators, one for the leading edges time differences and the other for the trailing edges time differences. Various other parts of the circuitry could be embodied with different topology, as is apparent to one of ordinary skill in the art. Such and other variations are within the scope of the invention.

All references referred to herein are incorporated by reference in their entireties.

What is claimed is:

1. A feedback comprising:
   at least one ramp generator for generating a first ramp-like signal in response to a first edge of a first input pulse signal having a first duration, the at least one ramp generator further generating a second ramp-like signal in response to a second edge of the first input pulse signal;

a clocked analog to digital converter circuit located downstream of the ramp generator and being actuated by a first edge of a second input signal having a second duration to produce a first digital sample, the clocked analog to digital converter circuit further being actuated by a second edge of the second input pulse signal to produce a second digital sample;

a conversion circuit for generating a digital correction signal by differencing the first digital sample from the second digital sample wherein the digital correction signal represents a difference between the first duration and the second duration; and a digital low pass filter for filtering the digital correction signal to produce a filtered correction signal.

2. The feedback circuit of claim 1 wherein:
the feedback circuit is embodied entirely as a single semiconductor chip.

3. The feedback circuit of claim 1 further comprising:
an upsampling modulator for reducing the precision of the filtered correction signal.

4. The feedback circuit of claim 1 further comprising:
a digital to analog converter adapted to receive the filtered correction signal and produce an analog correction signal.

5. The feedback circuit of claim 4 further comprising:
a low pass filter adapted to receive the analog correction signal.

6. The feedback circuit of claim 5 wherein:
the feedback circuit is embodied as a single semiconductor chip.

7. A synchronized oscillator comprising:
a reference clock input adapted to receive a reference clock signal;
a synchronizing signal input adapted to receive a synchronizing edge;
a voltage-controlled oscillator for generating an output clock signal at an output clock frequency, the voltage-controlled oscillator resetting in response to the synchronizing edge, the voltage-controlled oscillator having a correction input to receive a correction signal for controlling the output clock frequency; and
a feedback circuit adapted to receive the output clock signal and the reference clock signal, the feedback circuit generating the correction signal,
wherein the correction signal is generated by the acts of:
   a) digitizing a first difference between leading edges of a first pulse having a first duration in proportion to frequency of the output clock signal and of a second pulse having a second duration in proportion to a frequency of the reference clock,
   b) digitizing a second difference between trailing edges of the first pulse and the second pulse,
   c) differencing the first difference and the second difference to produce a third difference, and
   d) performing digital to analog conversion upon a signal derived from the third difference.

8. The synchronized oscillator of claim 7 wherein:
the correction signal is further generated by the act of:
   e) filtering the third difference using a digital filter upstream of the performing digital to analog conversion.

9. The synchronized oscillator of claim 7 wherein:
the correction signal is further generated by the act of:
   e) reshaping quantization noise in a signal derived from the third difference to a lower precision using an oversampling modulator.

10. The synchronized oscillator of claim 7 wherein:
the correction signal is further generated by the act of:
   e) filtering the correction signal using a low pass filter downstream of the performing digital to analog conversion.

11. A method for generating a feedback signal comprising the acts of:
   a) digitizing a first difference between leading edges of a first pulse having a first duration in proportion to a frequency of an output clock signal and of a second pulse having a second duration in proportion to a frequency of a reference clock,
   b) digitizing a second difference between trailing edges of the first pulse and the second pulse,
   c) differencing the first difference and the second difference to produce a third difference, and
   d) performing digital to analog conversion upon a signal derived from the third difference.

12. The method of claim 11 further comprising the act of:
   e) filtering the third difference using a digital filter upstream of the performing digital to analog conversion.

13. The method of claim 11 further comprising the act of:
   e) reshaping quantization noise in the third difference to a lower precision using an oversampling modulator.

14. The method of claim 11 further comprising the act of:
   c) filtering the feedback signal using a low pass filter downstream of the performing digital to analog conversion.

15. A filter comprising:
an analog to digital converter adapted to receive an input analog signal and further adapted to generate a corresponding unfiltered digital signal;
a digital filter adapted to receive the unfiltered digital signal and further adapted to produce a corresponding filtered digital signal;
an oversampling modulator adapted to receive the filtered digital signal and further adapted to produce a corresponding modulated digital signal wherein the modulated digital signal has lower precision than the filtered digital signal;
a digital to analog converter adapted to receive the modulated digital signal and further adapted to produce a corresponding filtered analog signal; and
an analog low pass filter adapted to receive the filtered analog signal and further adapted to produce a corresponding smoothed analog signal.

16. The filter of claim 15 wherein:
the oversampling modulator is a Sigma-Delta modulator.

17. The filter of claim 15 wherein:
the filter is embodied as a single semiconductor chip.

18. The filter of claim 15 wherein:
the analog low pass filter has a time constant, and
the digital filter has a time constant greater than the time constant of the analog low pass filter.

19. The filter of claim 18 wherein:
the digital filter is a low pass filter.

* * * * *